United States Patent [19]

Fujita et al.

[11] Patent Number: 5,319,223
[45] Date of Patent: Jun. 7, 1994

[54] HIGH ELECTRON MOBILITY TRANSISTOR

[75] Inventors: Shinobu Fujita; Takao Noda, both of Yokohama; Yasuo Ashizawa, Kawasaki, all of Japan

[73] Assignee: Kabushiki Kaisha Toshiba, Kawasaki, Japan

[21] Appl. No.: 918,057

[22] Filed: Jul. 24, 1992

[30] Foreign Application Priority Data

Jul. 26, 1991 [JP] Japan .................. 3-187553
May 21, 1992 [JP] Japan .................. 4-128967

[51] Int. Cl.$^5$ .......................... H01L 29/80
[52] U.S. Cl. ................... 257/190; 257/194; 257/201
[58] Field of Search ............ 257/190, 194, 191, 201

[56] References Cited

U.S. PATENT DOCUMENTS

| | | | |
|---|---|---|---|
| 4,833,101 | 5/1989 | Fujii | 437/111 |
| 4,855,797 | 8/1989 | Kohn et al. | 257/194 |
| 4,996,163 | 2/1991 | Sasaki | 257/194 |
| 5,148,245 | 9/1992 | Takikawa et al. | 257/194 |
| 5,170,230 | 12/1992 | Takikawa | 257/194 |

FOREIGN PATENT DOCUMENTS

| | | | |
|---|---|---|---|
| 60-86872 | 5/1985 | Japan . | |
| 60-231366 | 11/1985 | Japan | 257/194 |
| 62-035677 | 2/1987 | Japan | 257/194 |
| 62-252975 | 11/1987 | Japan | 257/194 |
| 63-111673 | 5/1988 | Japan | 257/194 |
| 63-228763 | 9/1988 | Japan . | |
| 64-41273 | 2/1989 | Japan . | |
| 64-74765 | 3/1989 | Japan . | |

OTHER PUBLICATIONS

Loualiche et al., "Low-Temperature DC Characteristics of Pseudomorphic $Ga_{0.18}In_{0.82}P/InP/Ga_{0.47}In_{0.53}As$ HEMT," Apr. 1990, *IEEE Electron Device Letters*, vol. 11, No. 4, pp. 153–154.

Applied Physics Letters 55, 2099 (Nov. 13, 1989), pp. 2099–2101: "Pseudomorphic GaInP Schottky Diode and High Electron Mobility Transistor On InP"; S. Loualiche, et al.

Denshi Tsushin Gakkai Gijutsu Kenkyu Hokoku SSD81-95 (1981), pp. 45–49: "TiW Silicide Gate Technology for Self-Aligned GaAs MESFET VLSI"; N. Yokoyama, et al.

*Primary Examiner*—Jerome Jackson
*Assistant Examiner*—Courtney A. Bowers
*Attorney, Agent, or Firm*—Oblon, Spivak, McClelland, Maier & Neustadt

[57] ABSTRACT

A high electron mobility transistor (HEMT) comprises an InGaAs channel layer formed on a semi-insulating InP substrate via a buffer layer, and an n-type InAℓAs electron supply layer formed on the channel layer via a spacer layer. On the electron supply layer, formed is an InGaAℓP Schottky contact layer, on which a Schottky gate electrode is formed. Source and drain electrodes are formed on the Schottky contact layer via an InGaAs ohmic contact layer, interposing the Schottky gate electrode therebetween. Thus, there is provided an InAℓAs/InGaAs HEMT having a high gate breakdown voltage, and exhibiting a small variance of characteristics.

10 Claims, 8 Drawing Sheets

HIGH ELECTRON MOBILITY TRANSISTOR

BACKGROUND OF THE INVENTION

1. Field of the Invention

The present invention relates to a high electron mobility transistor.

2. Description of the Related Art

Conventionally known are high electron mobility transistors having a structure in which an InGaAs channel layer and InAlAs electron supply layer are formed on a semi-insulating InP substrate. A cross sectional view of the structure is shown in FIG. 9, and the production steps of manufacturing a high electron mobility transistor having the structure are shown in FIGS. 10A to 10D.

The production steps will be explained in detail. First, a buffer layer 22 of non-doped InP or InAlAs, which lattice-matches with InP, is formed on a semi-insulating InP substrate 21, and then, on this buffer layer 22, formed are a non-doped InGaAs channel layer 23, a non-doped InAlAs spacer layer 24, a high impurity concentration n-type InAlAs electron supply layer 25, a non-doped InAlAs Schottky contact layer 26, and a high impurity concentration n-type InGaAs ohmic contact layer 27, in the mentioned order (FIG. 10 A). The layers 22 to 27 are formed by an organic metal chemical vapor deposition (MOCVD) method or a molecular beam epitaxy (MBE) method.

Next, ohmic electrodes 29 and 30, serving as a source and drain, respectively, are formed by vapor deposition, and high impurity concentration n-type layers 31 and 32 are formed underneath the ohmic electrodes 29 and 30, respectively, by an alloying process (FIG. 10B). After that, a resist mask 33 having an opening at a section corresponding to the gate electrode region is formed, and while monitoring source and drain currents, a section of the ohmic contact layer 27, which corresponds to the gate region, is etched to make a recess until the InAlAs Schottky contact layer 26 is exposed (FIG. 10C). Lastly, a Schottky gate electrode metal layer formed of a Ti/Pt/Au multilayer is deposited, and a gate electrode 28 is patterned by a lift-off process (FIG. 10D).

Such conventional HEMTs have the following problems.

First, a Schottky barrier having a sufficient height is not formed between the InAlAs Schottky contact layer and the gate electrode; therefore a sufficient gate breakdown voltage cannot be obtained. With a Schottky contact layer formed of such a material, the Schottky barrier height can hardly be changed by use of any type of gate electrode metal.

Second, the element characteristics, especially, the gate characteristics, widely vary. This is because the etching selectivity for wet etching between the InAlAs Schottky contact layer 26 and InGaAs ohmic contact layer 27 is low, and the above-mentioned recess etching for exposing the InAlAs Schottky contact layer 26 cannot be well controlled. If occurs a wide variance of the element characteristics, high-quality integrated circuits cannot be obtained.

Third, since impurities contained in the organic metal material for Al, such as Si and O are mixed into the non-doped InAlAs layer formed by the MOCVD method while a layer being grown, the purity of the grown layer will be poor as compared to that of the non-doped InGaAs layer. As a result, the electron mobility of the secondary electron gas (2DEG) accumulated around the interface between the InGaAs channel layer and the InAlAs spacer layer is lowered due to dispersion of impurities contained in the spacer layer. Further, a large leak current occurs between the InAlAs Schottky contact layer and the gate electrode. Thus, the performance of the device is deteriorated.

Fourth, InAlAs layers are easily affected when brought into contact with air or moisture, and therefore the section of the InAlAs layer, which is exposed when forming the gate electrode, is affected, thereby deteriorating the Schottky characteristics.

The third and fourth problems are created because InAlAs, which lattice-matches with InP, has the composition of $In_{0.52}Al_{0.48}As$, and the composition ratio of active Al of the group III elements is as large as 0.5.

There is a technique for enhancing the characteristics of the device by making the concentration of the 2DEG higher than that of an InAlAs/InGaAs HEMT which lattice-matches with InP. Based on this technique, the Al content ratios in the n-type InAlAs electron supply layer and the non-doped InAlAs spacer layer are made larger than 0.48, the ratio while lattice-matching, so as to enlarge the discontinuity of the conducting band between the InGaAs channel layer and the hetero junction layer. However, here arises another problem, the fifth one, the crystallization of InAlAs will be poor as the composition ratio of Al becomes larger and larger than 0.48, and the third and fourth problems will be even worse.

In the meantime, known is a high electron mobility transistor having an InGaAs channel layer and InGaP electron supply layer (for example, Published Unexamined Japanese Patent Application (PUJPA) No. 63-228763). However, the conducting band discontinuity between InGaAs and InGaP cannot be made as large as 0.52 eV which is the case of the discontinuity between InGaAs and InAlAs.

SUMMARY OF THE INVENTION

As described, conventional InAlAs/InGaAs HEMTs include the problems of poor gate break-down voltage, and wide variance of element characteristics. The purpose of the present invention is to provide a HEMT which is free from the above-mentioned problems.

According to the invention, there is provided a HEMT comprising: a main structure portion including a channel layer, a spacer layer, and n-type electron supply layer, the channel layer formed on one side of the spacer layer, and the electron supply layer formed on the other side of the spacer layer; a semi-insulating semiconductor substrate for supporting the main structure portion; a Schottky contact layer formed on the main structure portion; a Schottky gate electrode formed on said Schottky contact layer; first and second ohmic contact layer formed on the Schottky contact layer, interposing Schottky gate electrode therebetween; and a first ohmic electrode formed on the first ohmic contact layer; and second ohmic electrode formed on the second ohmic contact layer.

In a first aspect of the invention, the electron supply layer has a structure represented by $In_mAl_nAs$ (where $m+n=1$, $0<m$, $0<n$), and the Schottky contact layer has a structure represented by $In_xGa_yAl_zP$ (where $x+y+z=1$, $0\leq x\leq 0.9$, $0\leq z\leq 0.5$). Each of the first and second ohmic contact layers preferably has a structure represented by $In_sGa_tAs$ (where $s+t=1$, $0 \leq s$, $0 \leq t$, preferably $0<s$, $0<t$).

In a second aspect of the invention, the electron supply layer has a structure represented by $In_uGa_vAl_wP$ (where $u+v+w=1$, $0 \leq u \leq 0.9$, $0<w \leq 0.5$), and the Schottky contact layer has a structure represented by $In_xGa_yAl_zP$ (where $x+y+z=1$, $0 \leq x \leq 0.9$, $0 \leq z \leq 0.5$). Preferably, the spacer layer has a structure represented by $In_hGa_iAl_jP$ (where $h+i+j=1$, $0 \leq h \leq 0.9$, $0 \leq j \leq 0.5$).

In the HEMT prepared in the first aspect of the invention, an InGaAlP layer is employed as a Schottky contact layer, and therefore a high Schottky barrier is formed between the InGaAlP layer and the gate metal electrode of Ti/Pt/Au or the like. Thus, the achieved gate break-down voltage is better than that of conventional techniques, and the gate leak current is smaller. Moreover, in the case where the ohmic contact layer is made of InGaAs, a high etching selection ratio between the ohmic contact and the Schottky contact layers, can be obtained. Therefore, in the recess-etching step for the gate region, the InGaAlP Schottky contact layer serves as a sufficient stopper, and a high controllability of the recess-etching can be achieved. Accordingly, an element with a narrow range of variance of characteristics can be obtained.

According to the first aspect of the invention, by use of an InGaAlP layer as the Schottky contact layer, a HEMT with a high gate break-down voltage, and a narrow range of variance of element characteristics, can be obtained.

According to the second aspect of the invention, $In_pGa_qAl_rP$ (where $p+q+r=1$) is used as a spacer layer, electron supply layer, and Schottky contact layer. Regarding an $In_pGa_qAl_rP$, when the ratio of In is not 1, the layer does not lattice-match with the InP substrate. However, when the electron supply layer comprises a planar doped layer, the total thickness of the spacer, electron supply layer, and Schottky contact layer can be thinned to 10 nm or less. Consequently, by selecting appropriate p, q, and r, a InGaAlP film having a critical film thickness can be obtained, and accordingly the above-mentioned layers can be prepared.

In a group III-V compound semiconductor, it is generally true that if the ratio r of Al of the group III is 0.35 or less, undesirable effects such as contamination of impurities, and degradation of growth layer, due to active Al, will be very small. The conductive band discontinuity of the hetero junction of InGaAlP/InGaAs can be raised to 0.52 eV or higher even if the Al ratio r is 0.3 or less. Thus, the hetero junction of InGaAlP/InGaAs has a larger conductive band discontinuity than that of InAlAs/InGaAs, and a high 2DEG concentration can be obtained.

According to the second aspect of the invention, there is provided a HEMT having good and stable characteristics, especially, transconductance and gate break-down voltage by use of InGaAlP at least in the electron supply layer and the Schottky contact layer.

It should be noted that InAlAs and InGaAs should correctly be represented as $In_mAl_nAs$ (where $m+n=1$, $0<m$, $0<n$), and $In_sGa_tAs$ (where $s+t=1$, $0 \leq s$, $0 \leq t$, preferably $0<s$, $0<t$); however composition parameters are, in some case, omitted for simplification purpose.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
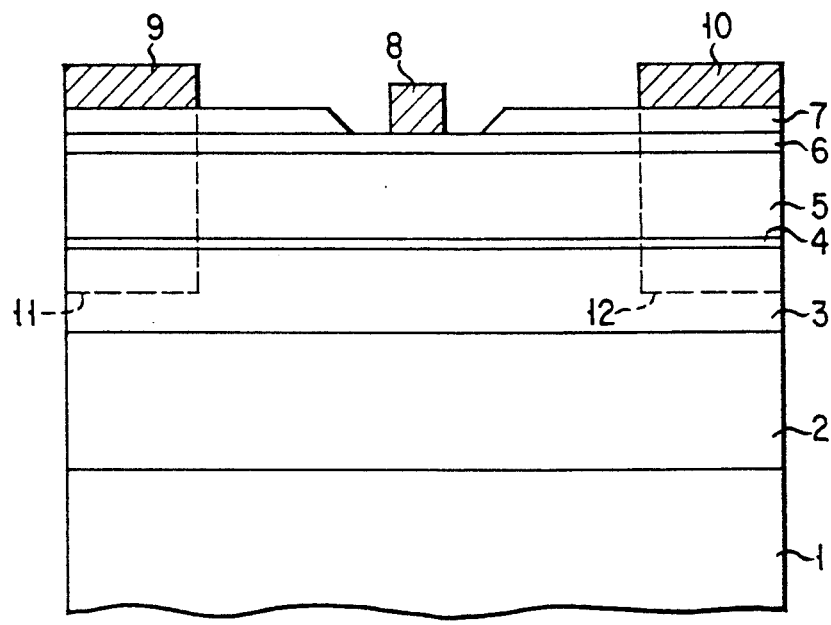
FIG. 1 is a cross sectional view of a HEMT according to a first embodiment of the present invention.

FIG. 1 is a cross sectional view showing a structure of a HEMT according to the first embodiment of the present invention, and FIGS. 2A to 2D show cross sectional views of the first embodiment at several steps in its manufacturing process. The first embodiment will be explained with reference to the manufacturing steps thereof.

First, a 50 to 500 nm-thick buffer layer 2 is formed on a semi-insulating substrate 1. In the case where the substrate 1 is made of semi-insulating InP, the buffer layer 2 should be made of non-doped InP or InAlAs which lattice-matches with InP. In the case where the substrate 1 is made of semi-insulating GaAs, the buffer layer 2 should be formed of an InGaAs graded buffer layer in which the In component is gradually increased, so as to lattice-match with the substrate.

Next, a 10 to 100 nm-thick non-doped InGaAs channel layer 3, and a 2 to 5 nm-thick non-doped InAlAs spacer layer 4 are formed.

Figure 2A:
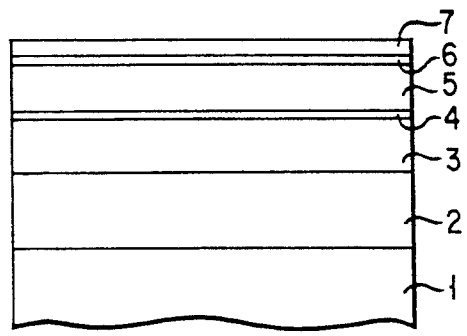
FIGS. 2A to 2D are cross sectional views showing steps for manufacturing the HEMT according to the first embodiment of the invention.

Formed next is a high impurity concentration n-type InAlAs electron supply layer 5 having a thickness of 10 to 30 nm, and containing impurities doped therein so as to have an electron concentration of $3 \times 10^{18}/cm^3$, and a 5 to 20 nm-thick non-doped $In_xGa_yAl_zP$ Schottky contact layer 6 (where $x+y+z=1$, $0 \leq x \leq 0.9$, $0 \leq z \leq 0.5$). Then, formed is a high impurity concentration n-type InGaAs ohmic contact layer 7 having a thickness of 10 to 30 nm, and containing impurities doped therein so as to have an electron concentration of $3 \times 10^{18}/cm^3$. These layers 2 to 7 are formed subsequently by the epitaxial growth technique (FIG. 2A).

Figure 2B:
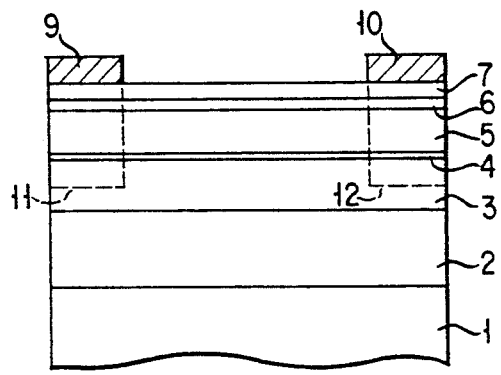
Figure 2C:
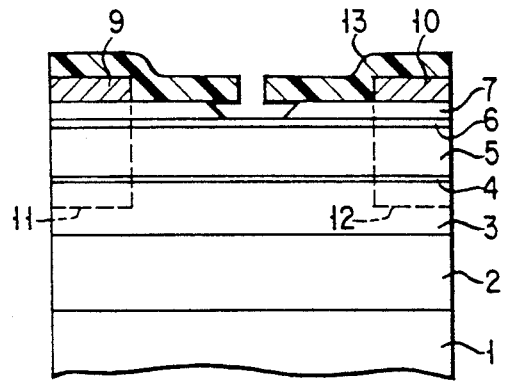

After that, source and drain ohmic electrodes 9 and 10 are formed by deposition, and high impurity concentration n-type layers 11 and 12 are formed underneath the ohmic electrodes 9 and 10, respectively, by alloying process (FIG. 2B). Then, a resist mask 13 having an opening at the section corresponding to the gate electrode region is formed, and the gate region section of the ohmic contact layer 7 is recess-etched to expose the corresponding region of the InGaAℓP Schottky contact layer 6 (FIG. 2C).

For the recess-etching, a phosphoric acid etching solution such as one containing phosphoric acid and hydrogen peroxide solution is used. In the etching solution, the etching speed for InGaAℓP is 1/10 or less than InGaAs, and therefore a large etching selection ratio between InGaAℓP and InGaAs can be obtained. Therefore, without monitoring a current, the InGaAℓP Schottky contact layer 6 can be exposed with a good controllability.

Figure 2D:
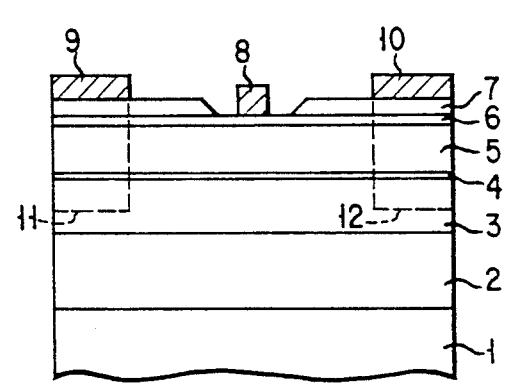

Then, a Schottky gate electrode 8 consisting of a Ti/Pt/Au multilayered film is formed on the exposed section of the InGaAℓP Schottky contact layer 6 by the lift-off technique as employed in conventional techniques (FIG. 2D).

It should be pointed out that when the etching time of recess-etching of the gate electrode is prolonged, side-etching of the InGaAs ohmic contact layer 7 proceeds, thereby obtaining a wide-recess structure. This is effective when the concentration of the electrical field at the gate region is reduced, and thereby the gate breakdown voltage can be raised.

Specific examples of the first embodiment will now be explained.

EXAMPLE 1

First, a 60 nm-thick non-doped InAℓAs buffer layer 2, which lattice-matches with a semi-insulating InP substrate 1, was formed on the substrate. Then, a 40 nm-thick non-doped InGaAs channel layer 3 was grown on the above buffer layer. Grown next were a 2 nm-thick non-doped InAℓAs spacer layer 4, and a 15 nm-thick n-type InAℓAs electron supply layer 5 containing Si doped thereinto as an n-type impurity so as to have an electron concentration of $3 \times 10^{18}/cm^3$. Then, grown were a 5 nm-thick non-doped $In_{0.7}(Ga_{0.5}Aℓ_{0.5})_{0.3}P$ Schottky contact layer 6, and a 10 nm-thick high impurity concentration n-type InGaAs ohmic contact layer 7 containing Si doped thereinto so as to have an electron concentration of $3 \times 10^{18}/cm^3$ (FIG. 2A). The epitaxial growth of each of the above-mentioned layers was carried out by the MOCVD method.

Next, source and drain ohmic electrodes 9 and 10 were formed by deposition, and high impurity concentration n-type layers 11 and 12 were formed underneath the ohmic electrodes 9 and 10 by an alloying technique (FIG. 2B). The resist mask 13 having an opening at the section corresponding to the gate electrode region was formed by drawing a pattern directly with electron beam exposure, and the gate region section of the ohmic contact layer 7 was recess-etched to expose a part of the InGaAℓP Schottky contact layer 6 (FIG. 2C). The size of the resist opening was set to be 0.2 μm.

In the recess-etching, a phosphoric acid etching solution containing $H_3PO_4 + H_2O_2 + H_2O$ (3:1:50) was used. With this etching solution, InGaAℓP was hardly etched.

Then, as gate electrode metals, Ti, Pt, and Au were subsequently deposited, and this deposition layer was subjected to the lift-off process to form the pattern of the gate electrode 8 (FIG. 2D). Thus, a HEMT having the gate length of 0.25 μm was obtained.

Regarding the HEMT manufactured in Example 1, the drain saturation current, transconductance, and pinch-off voltage were measured. The results exhibited that the variance of each of these characteristics was about 50% less than those of the conventional device. Further, the gate-source reverse direction leak current was about ¼ of that of the conventional device, and the gate-source reverse break-down voltage was about three times as large as that of the conventional device.

EXAMPLE 2

By use of a GaAs substrate, employing a gas source MBE method for crystal growth, and the production method shown in FIGS. 2A to 2D, a HEMT according to the first embodiment of the invention was manufactured.

First, an InGaAs graded buffer layer 2, whose In component gradually increases so as to lattice-matches with a semi-insulating GaAs substrate 1, was formed thereon. Then, a 40 nm-thick non-doped InGaAs channel layer 3 was grown on the above buffer layer. Grown next were a 2 nm-thick non-doped InAℓAs spacer layer 4, and a 15 nm-thick n-type InAℓAs electron supply layer 5 containing Si doped thereinto as an n-type impurity, so as to have an electron concentration of $3 \times 10^{18}/cm^3$. Then, grown were a 5 mn-thick non-doped $In_{0.7}(Ga_{0.5}Aℓ_{0.5})_{0.3}P$ Schottky contact layer 6 and a 10 nm-thick high concentration n-type InGaAs ohmic contact layer 7 containing Si doped thereinto so as to have an electron concentration of $3 \times 10^{18}/cm^3$ (FIG. 2A).

Next, as in Example 2, source and drain ohmic electrodes 9 and 10 were formed by deposition, and high impurity concentration n-type layers 11 and 12 were formed underneath the ohmic electrodes 9 and 10 by an alloying technique (FIG. 2B). The resist mask 13 having an opening at the section corresponding to the gate electrode region was formed by drawing a pattern directly with electron beam exposure, and the gate region section of the ohmic contact layer 7 was recess-etched to expose a part of the InGaAℓP Schottky contact layer 6 (FIG. 2C). The size of the resist opening was set to be 0.2 μm. In the recess-etching, a phosphoric acid etching solution containing $H_3PO_4 + H_2O_2 + H_2O$ (3:1:50) was used.

Then, as gate electrode metals, Ti, Pt, and Au were subsequently deposited, and this deposition layer was subjected to the lift-off process to form the pattern of the gate electrode 8 (FIG. 2D). Thus, a HEMT having the gate length of 0.25 μm was obtained.

The HEMT thus manufactured in Example 2 was compared with the conventional device, in terms of drain saturation current, transconductance, and pinch-off voltage. The results exhibited that the variance of each of these characteristics was about 50% less than those of the conventional device. Further, the gate-source reverse direction leak current was about ¼ of that of the conventional device, and the gate-source reverse break-down voltage was about three times as large as that of the conventional device.

FIGS. 3A to 3D are cross sectional views showing steps of manufacturing a HEMT according to the second embodiment of the invention. Portions in FIG. 3 which correspond to those of the first embodiment shown in FIG. 2, are designated by the same reference numerals as those of the first embodiment. In this embodiment, the electron supply layer is made by a planer doping method. Specific examples of this embodiment will now be explained.

EXAMPLE 3

Figure 3A:
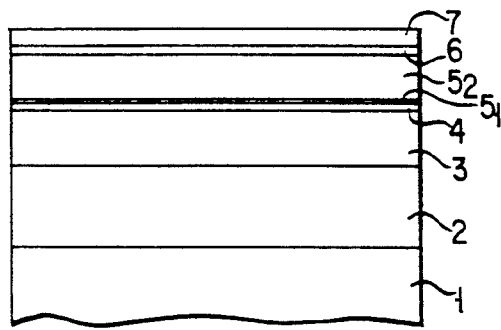
FIGS. 3A to 3D are cross sectional views showing steps for manufacturing a HEMT according to a second embodiment of the invention.

A 50 nm-thick non-doped InP buffer layer 2 was grown on a semi-insulating InP substrate 1. Then, a 30 nm-thick non-doped InGaAs channel layer 3 which lattice-matches with the InP substrate, and a 5 nm-thick non-doped InAɩAs layer 4 were grown thereon. Then, an Si planer doped layer $5_1$ was formed so that the sheet carrier concentration becomes $3 \times 10^{12}/cm^2$, and 15 nm-thick non-doped InAɩAs layer $5_2$ was further grown thereon. Grown next were a 5 nm-thick non-doped InGaAɩP Schottky contact layer 5, and a 10 nm-thick high concentration n-type InGaAs ohmic contact layer 7 containing Si doped thereinto so as to have an electron concentration of $3 \times 10^{18}/cm^3$ (FIG. 3A). The epitaxial growth of each of the above-mentioned layers was carried out by the MOCVD method.

Figure 3B:
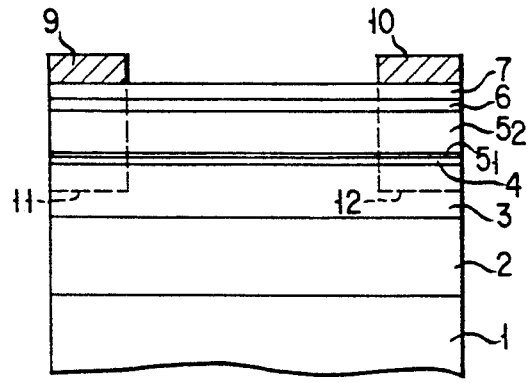
Figure 3C:
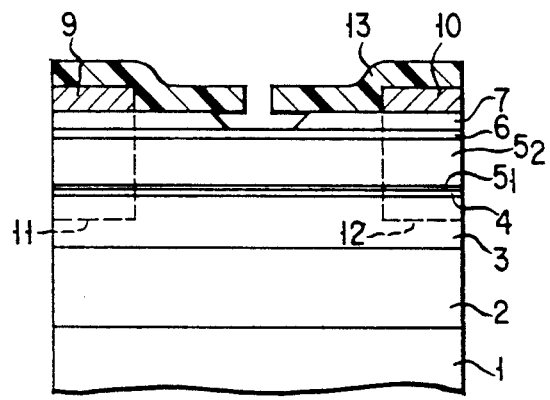
Figure 3D:
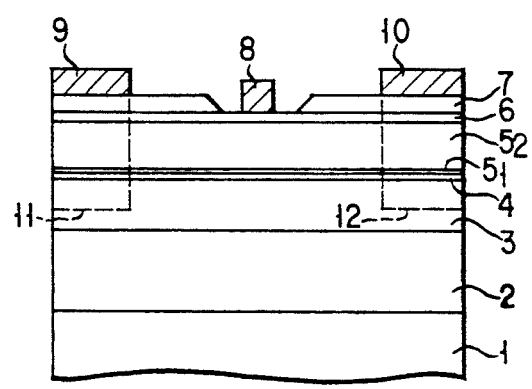

After that, source and drain ohmic electrodes 9 and 10 were formed by deposition, and high impurity concentration n-type layers 11 and 12 were formed underneath the ohmic electrodes 9 and 10 by an alloying technique (FIG. 3B). A resist mask 13 having an opening at the section corresponding to the gate electrode region was formed by drawing a pattern directly with electron beam exposure, and the gate region section of the ohmic contact layer 7 was recess-etched to expose a part of the InGaAɩP Schottky contact layer 6 (FIG. 3C). Then, as gate electrode metals, Ti, Pt, and Au were subsequently deposited, and this deposition layer was subjected to the lift-off process to form the pattern of the gate electrode 8 (FIG. 3D).

The HEMT thus manufactured in Example 3 was compared with the conventional device in terms of drain saturation current, transconductance, and pinch-off voltage. The results exhibited that the variance of each of these characteristics was about 50% less than those of the conventional device. Further, the gate-source reverse direction leak current was about ⅓ of that of the conventional device, and the gate-source reverse break-down voltage was about three times as large as that of the conventional device.

Figure 4:
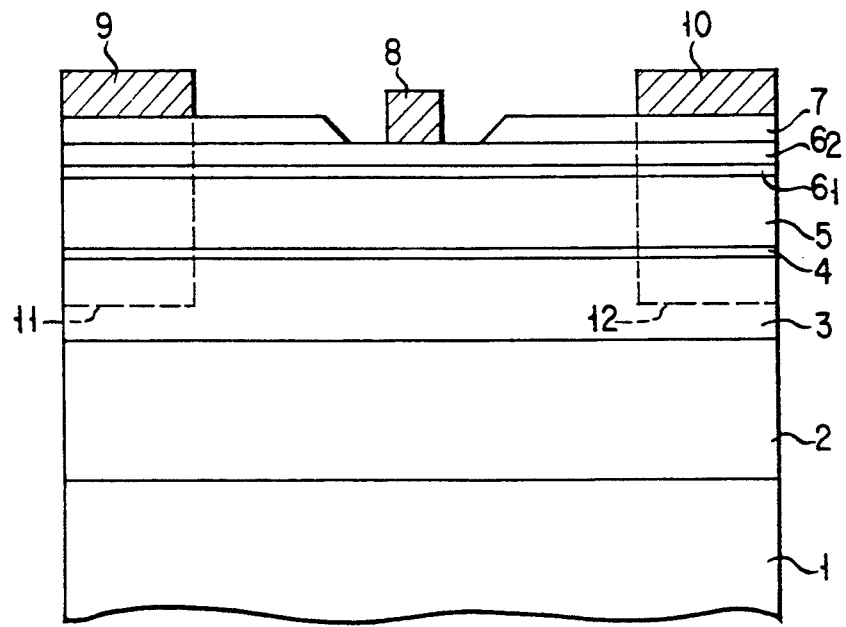
FIG. 4 is a cross sectional view of a HEMT according to a third embodiment of the invention.

FIG. 4 is a cross sectional view of a HEMT according to the third embodiment of the invention. Portions in FIG. 4 which correspond to those of the first embodiment shown in FIG. 1, are designated by the same reference numerals as those of the first embodiment.

In this embodiment, the Schottky contact layer includes two layers $6_1$ and $6_2$. The layer $6_1$ is made of non-doped InAɩAs, preferably $In_{0.52}Aɩ_{0.48}As$, and the thickness thereof should be in the range between 5 to 15 nm, preferably 10 nm. The layer $6_2$ is made of non-doped $In_xGa_yAɩ_zP$ (where $x+y+z=1$, $0 \leq x \leq 0.9$, $0 \leq z \leq 0.5$), and has a thickness of 5 to 20 nm. The other elements are identical to those in the first embodiment, more accurately the Example 1, and therefore the explanations thereof are omitted.

Figure 5:
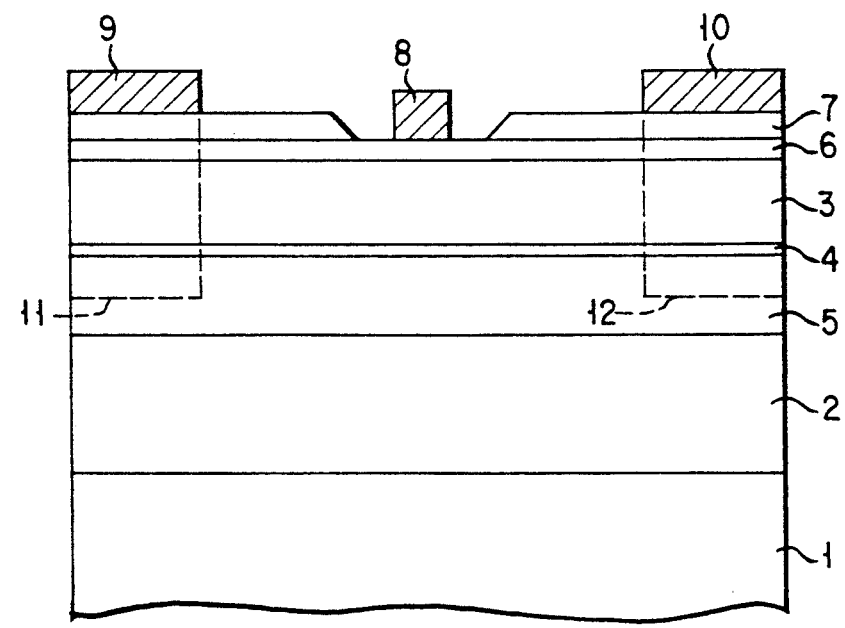
FIG. 5 is a cross sectional view of a HEMT according to a fourth embodiment of the invention.

FIG. 5 is a cross sectional view of a HEMT according to the fourth embodiment of the invention. Portions in FIG. 5 which correspond to those of the first embodiment shown in FIG. 1, are designated by the same reference numerals as those of the first embodiment.

The device manufactured in this embodiment is a so-called reverse HEMT, in which the channel layer 3, spacer layer 4, and electron supply layer 5 are formed in the reverse order to that in the first embodiment. Since the composition and thickness of each of the mentioned layers as well as the other layers are the same as those of the first embodiment, more accurately the Example 1, the detailed explanations thereof will be omitted.

In the first through fourth embodiments, InGaAs and InAɩAs which constitute those layers should preferably have the compositions of $In_{0.53}Ga_{0.47}As$ and $In_{0.52}Aɩ_{0.48}As$ for lattice matching with the substrate. However, the channel layer may be made of $In_{1-x}Ga_xAs$ (where $0.25 \leq x \leq 0.46$) which does not lattice-match with the substrate. Further, the InGaAɩP Schottky contact layer 6 should have a thickness less than the critical value beyond which conversion due to lattice-mismatching occurs. It is essential that the InGaAɩP Schottky contact layer includes P of the group V, but the layer may partially contain As and the like.

Figure 6:
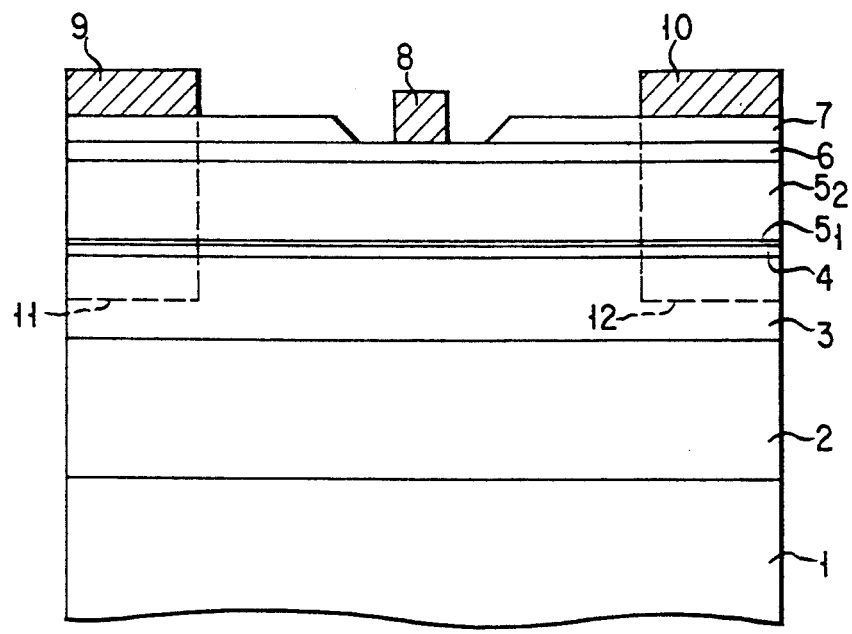
FIG. 6 is a cross sectional view of a HEMT according to a fifth embodiment of the invention.

FIG. 6 is a cross section of a HEMT according to the fifth embodiment of the invention, and FIGS. 7A to 7D show manufacturing steps thereof. Portions in FIGS. 6, and 7A to 7D, which correspond to those of the first embodiment shown in FIG. 1, are designated by the same reference numerals as those of the first embodiment. The fifth embodiment will now be explained along with the manufacturing steps.

First, a 50 to 500 nm-thick buffer layer 2 is formed on a semi-insulating substrate 1. In the case where the substrate 1 is formed of semi-insulating InP, the buffer layer 2 should be made of non-doped InP or InAɩAs which lattice-matches with InP. In the case where the substrate 1 is made of semi-insulating GaAs, the buffer layer 2 should be formed of an InGaAs or InAɩAs graded buffer layer in which the In component is gradually increased for lattice-matching with the substrate.

Next, a 10 to 100 nm-thick non-doped InGaAs channel layer 3, and a 1 to 3 nm-thick non-doped $In_hGa_iAɩ_jP$ spacer layer 4 (where $h+i+j=1$, $0 \leq h \leq 0.9$, $0 \leq j \leq 0.5$) are formed.

Then, a planer doped layer $5_1$ containing one of Si, Sn, and S is formed so that the sheet carrier concentration becomes $2 \times 10^{12}$ to $5 \times 10^{12}/cm^2$. Further, a 0 to 5 nm-thick $In_uGa_vAɩ_wP$ layer $5_2$ (where $u+v+w=1$, $0 \leq u \leq 0.9$, $0 < w \leq 0.5$), which is non-doped, or containing one of Si, Sn and S doped thereinto is formed. The layers $5_1$ and $5_2$ constitute an electron supply layer. In the case where the thickness of the InGaAɩP layer $5_2$ is 0 nm, the electron supply layer comprises the planer doped layer $5_1$ and a part of the spacer layer 4 adjacent thereto. Such a structure can be included in impurity-doped electron supply layers of the invention.

Figure 7A:
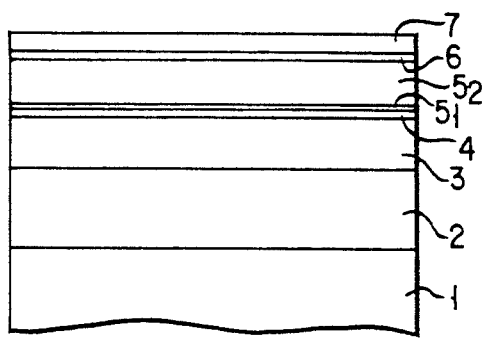
FIGS. 7A to 7D are cross sectional views showing steps for manufacturing the HEMT according to the fifth embodiment of the invention.

Formed next were a 1.5 to 10 nm-thick non-doped $In_xGa_yAɩ_zP$ Schottky contact layer 6 (where $x+y+z=1$, $0 \leq x \leq 0.9$, $0 \leq z \leq 0.5$), and a 10 to 30 nm-thick high impurity concentration n-type InGaAs ohmic contact layer 7 containing impurities doped thereinto so as to have an electron concentration of $3 \times 10^{18}/cm^3$. These layers 2 to 7 are grown subsequently by the epitaxial growth (FIG. 7A).

Figure 7B:
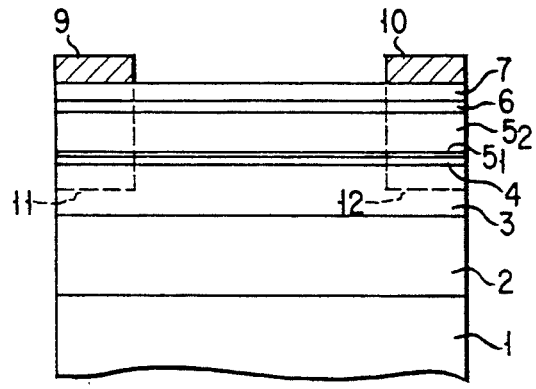
Figure 7C:
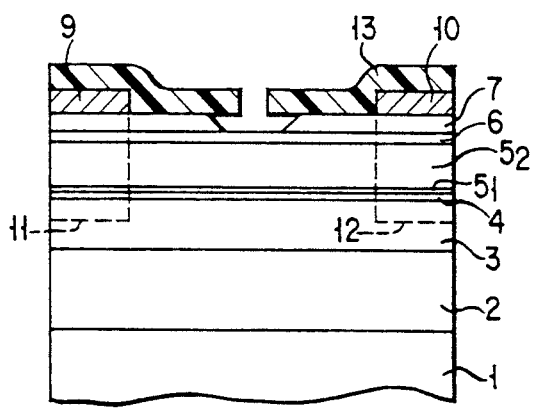

After that, source and drain ohmic electrodes 9 and 10 were formed by deposition, and high impurity concentration n-type layers 11 and 12 were formed underneath the ohmic electrodes 9 and 10 by an alloying technique (FIG. 7B). A resist mask 13 having an opening at the section corresponding to the gate electrode region was formed, and the gate region section of the ohmic contact layer 7 was recess-etched to expose a part of the InGaAℓP Schottky contact layer 6 (FIG. 7C).

In this recess etching, a phosphor acid etching solution such as that containing phosphor acid and hydrogen peroxide solution. Regarding this etching solution, the etching speed for InGaAℓP is 1/10 or less than that for InGaAs, and therefore a large etching selection ratio between InGaAℓP and InGaAs can be obtained. Accordingly, a part of the InGaAℓP Schottky contact layer 6 can be exposed with a good controllability without performing current monitor.

Figure 7D:
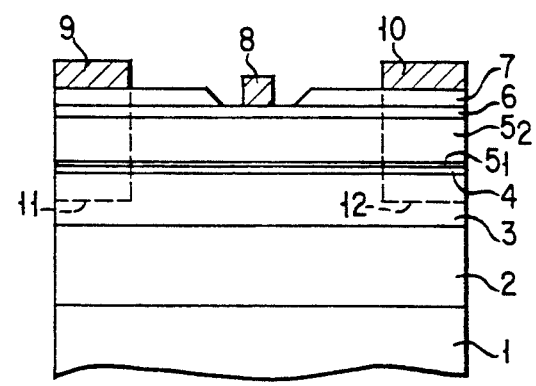
Figure 9:
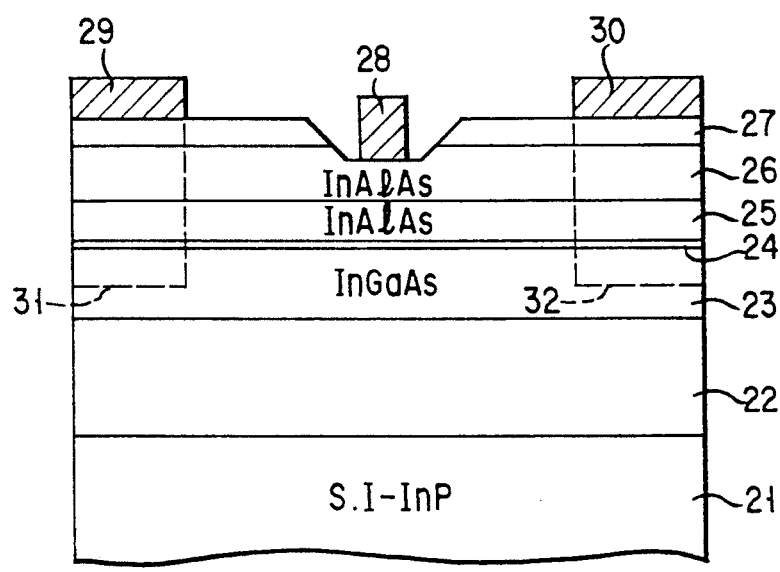
FIG. 9 is a cross sectional view of a conventional HEMT.
Figure 10A:
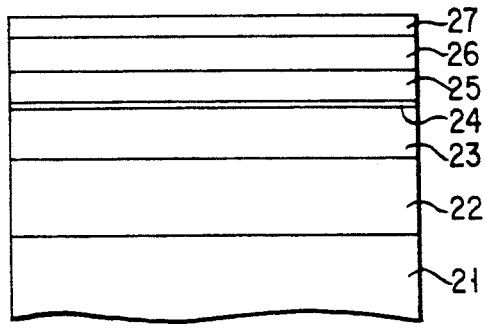
FIGS. 10A to 10D are cross sectional views showing steps for manufacturing the conventional HEMT.
Figure 10B:
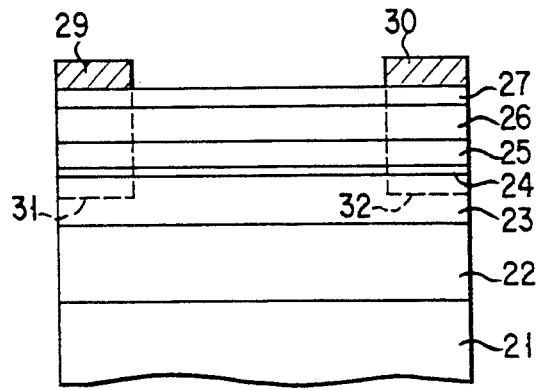
Figure 10C:
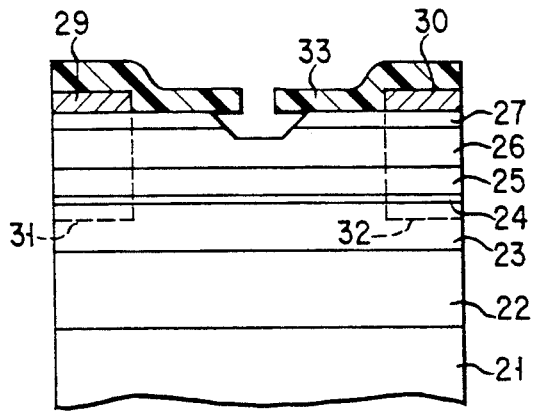
Figure 10D:
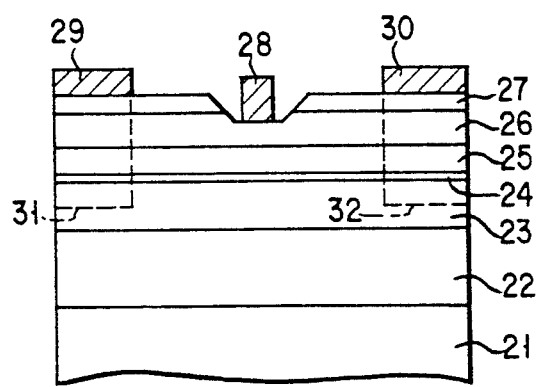

On the exposed section of the InGaAℓP Schottky contact layer 6, a Schottky gate electrode 8 consisting of a Ti/Pt/Au multilayer is formed by the lift-off process as in the conventional technique (FIG. 7D).

By prolonging the etching time in recess-etching of the gate electrode, side-etching further proceeds in the InGaAs ohmic contact layer 7, thereby obtaining a wide recess structure. This is very effective when the field concentration is reduced in the gate region, and thereby the gate break-down voltage can be raised.

Examples of the fifth embodiment will now be explained.

EXAMPLE 4

A 200 nm-thick non-doped InP buffer layer 2 was grown on an semi-insulating InP substrate 1, and a 50 nm-thick non-doped $In_{0.53}Ga_{0.47}As$ channel layer 3 which lattice-matches with InP, and a 3 nm-thick non-doped $In_{0.8}Ga_{0.1}Aℓ_{0.1}P$ spacer layer 4 were grown on this buffer layer. Then, an Si planer doped layer $5_1$ was formed so that the sheet carrier concentration was set at $3 \times 10^{12}/cm^2$. Formed next is a 5 nm-thick $In_{0.8}Ga_{0.1}Aℓ_{0.1}P$ electron supply layer $5_2$ containing Si doped thereinto so as to have an electron concentration of $5 \times 10^{18}/cm^3$. After that, formed were a 5 nm-thick non-doped $In_{0.8}Ga_{0.1}Aℓ_{0.1}P$ Schottky contact layer 6, and a 15 nm-thick high impurity concentration n-type $In_{0.53}Ga_{0.47}As$ ohmic contact layer 7 containing Si doped thereinto so as to have an electron concentration of $5 \times 10^{18}/cm^3$ (FIG. 7A).

The epitaxial growth of each of the above-mentioned layers was carried out by the MOCVD method as in Example 1, under the following conditions. The substrate temperature and the reaction tube pressure were 650° C. and 100 Torr, respectively, and group III materials used for growth were $In(CH_3)_3$, $Ga(CH_3)_3$, $Aℓ(CH_3)_3$, and group V ones were $PH_3$, $AsH_3$. Further, the dopant of Si doping was $Si_2H_6$.

After that, source and drain ohmic electrodes 9 and 10 were formed by deposition, and high-concentration n-type layers 11 and 12 were formed underneath the ohmic electrodes 9 and 10 by an alloying technique (FIG. 7B). A resist mask 13 having an opening at the section corresponding to the gate electrode region was formed by drawing a pattern directly with electron beam exposure, and the gate region section of the ohmic contact layer 7 was recess-etched to expose a part of the InGaAℓP Schottky contact layer 6 (FIG. 7C). Then, as gate electrode metals, Ti, Pt, and Au are subsequently deposited, and this deposition layer was subjected to the lift-off process to form the pattern of the gate electrode 8 (FIG. 7D).

The HEMT thus manufactured in Example 4 was compared with an InAℓAs/InGaAs HEMT. The results exhibited that the transconductance was 5% higher than the InAℓAs/InGaAs HEMT, and the gate-source reverse direction leak current was 1/10. Further, variance of the Schottky characteristic such as that admitted in the InAℓAs/InGaAs HEMT was not observed.

EXAMPLE 5

In connection with the fifth embodiment shown in FIGS. 6 and 7, an example having a larger conductive band discontinuity of the hetero junction between the electron supply layer and the spacer layer, than that of the InAℓAs/InGaAs HEMT, will now be explained.

First, a 200 nm-thick non-doped InP buffer layer 2 was formed on a semi-insulating InP substrate 1. Then, a 50 nm thick non-doped $In_{0.53}Ga_{0.47}As$ channel layer 3 which lattice-matches with InP, and a 3 nm non-doped $In_{0.75}Aℓ_{0.25}P$ spacer layer 4 were subsequently grown on the buffer layer. Then, an Si planer dope layer $5_1$ having a sheet carrier concentration set at $5 \times 10^{12}/cm^2$, and a 3 nm-thick non-doped $In_{0.75}Aℓ_{0.25}P$ layer $5_2$ were formed. After that, formed were a 1.5 nm-thick non-doped $In_{0.5}Ga_{0.5}P$ Schottky contact layer 6, and a 10 nm-thick high impurity concentration n-type $In_{0.53}Ga_{0.47}As$ ohmic contact layer 7 containing Si doped thereinto so as to have an electron concentration of $5 \times 10^{18}/cm^3$ (FIG. 7A).

The conditions for growth and material gases used here were the same as those of Example 4.

After that, source and drain ohmic electrodes 9 and 10 were formed by deposition, and high impurity concentration n-type layers 11 and 12 were formed underneath the ohmic electrodes 9 and 10 by an alloying technique (FIG. 7B). A resist mask 13 having an opening at the section corresponding to the gate electrode region was formed by drawing a pattern directly with electron beam exposure, and the gate region section of the ohmic contact layer 7 was recess-etched to expose a part of the InGaAℓP Schottky contact layer 6 (FIG. 7C). Then, as gate electrode metals, Ti, Pt, and Au are subsequently deposited, and this deposition layer was subjected to the lift-off process to form the pattern of the gate electrode 8 (FIG. 7D).

It should be noted here that though the Schottky contact layer 6 is as thin as 1.5 nm, a selection etching between InGaAs and InGaP can be easily achieved by a wet etching technique. Consequently, etching of the ohmic contact layer 7 can be performed such that the Schottky contact layer 6 is left.

The HEMT thus manufactured in Example 5 was compared with an InAℓAs/InGaAs HEMT. The results exhibited that the transconductance was 10% higher than the InAℓAs/InGaAs HEMT. This is because the conductive band discontinuity between the channel layer and the spacer layer was 0.08 eV larger than that of the InAℓAs/InGaAs HEMT, increasing the sheet electrode concentration of 2DEG. The gate-source reverse direction leak current was 1/100 of the InAℓAs/InGaAs HEMT, and no variance of the Schottky characteristic was observed. This is because Aℓ-free $In_{0.5}Ga_{0.5}P$ having a large Schottky barrier height was used on the top portion of the Schottky contact layer.

Figure 8:
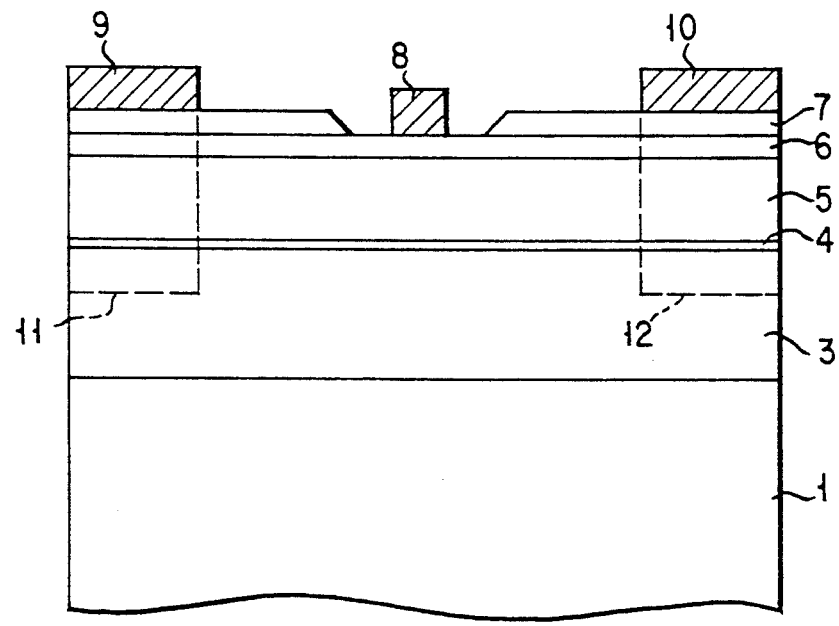
FIG. 8 is a cross sectional view of a HEMT according to a sixth embodiment of the invention.

FIG. 8 is a diagram showing a cross sectional view of an HEMT according to the sixth embodiment of the invention, and in this figure, portions corresponding to those of the fifth embodiment shown in FIG. 6 are designated by the corresponding numeral references of FIG. 6.

In this embodiment, first, on a semi-insulating InP substrate 1, formed is a 50 to 500 nm-thick non-doped InP channel layer 3, which can also serve as a buffer layer.

Then, on the channel layer, subsequently formed are a 1 to 3 nm-thick non-doped $In_hGa_iAl_jP$ spacer layer 4 (where $h+i+j=1$, $0 \leq h \leq 0.9$, $0 \leq j \leq 0.5$), and a 10 to 30 nm-thick high impurity concentration n-type $In_uGa_vAl_wP$ electron supply layer 5 (where $u+v+w=1$, $0 \leq u \leq 0.9$, $0 < w \leq 0.5$) containing an impurity, such as Si, Sn, or S, doped therein so as to have an electron concentration of $3 \times 10^{18}/cm^3$, and a 5 to 20 nm-thick non-doped $In_xGa_yAl_zP$ Schottky contact layer 6 (where $x+y+z=1$, $0 \leq x \leq 0.9$, $0 \leq z \leq 0.5$).

Next, as in the first embodiment, 10 to 30 nm-thick high impurity concentration n-type InGaAs ohmic contact layer 7 containing an impurity doped therein so as to have an electron concentration of $3 \times 10^{18}/cm^3$ is formed. Then, source and drain ohmic electrodes 9 and 10, and Schottky gate electrode 8 are provided, and high impurity concentration n-type layers 11 and 12 are formed underneath the ohmic electrodes 9 and 10 by an alloying technique.

In the fifth and sixth embodiments, parameters of the components corresponding to each other (for example, h, u, x) in the composition formulas of the layers 4, 5, $5_2$ and 6 may not be the same as each other, and ratios of the components may not be uniform even in each of the layers 4, 5, $5_2$ and 6. In other words, the InGaAlP composition ratios of the spacer layer, electron supply layer, and Schottky contact layer need not be uniform. For example, to make the conductivity band discontinuity in relation to the InGaAs channel layer as high as possible, and raise the concentration of 2DEG, InAlP having an Al ratio of the group III of as large as 0.25 to 0.35 is used to form the spacer layer and electron supply layer, and an Al-free thin film exhibiting a lattice-mismatching property, such as $In_{0.5}Ga_{0.5}P$ is formed only on the top portion of the Schottky contact layer, thereby the gate break-down voltage can be enhanced, and degradation of the surface can be suppressed.

In the $In_hGa_iAl_jP$ spacer layer (where $h+i+j=1$, $0 \leq h \leq 0.9$, $0 \leq j \leq 0.5$), preferable is $0 < j$, and more preferable is $0.6 \leq h \leq 0.8$, $0.2 \leq i \leq 0.4$, $0.2 \leq j \leq 0.4$. Similarly, in the $In_uGa_vAl_wP$ electron supply layer (where $u+v+w=1$, $0 \leq u \leq 0.9$, $0 < w \leq 0.5$), preferable is $0.6 \leq u \leq 0.8$, $0.2 \leq v \leq 0.4$, and $0.2 \leq w \leq 0.4$.

InGaAs and InAlAs used for forming layers should preferably have the following compositions, $In_{0.53}Ga_{0.47}As$ and $In_{0.52}Al_{0.48}As$, respectively, so as to lattice-match with the substrate. The channel layer may be made of $In_{1-x}Ga_xAs$ (where $0.25 \leq x \leq 0.46$), which does not lattice-match with the substrate. For example, it is possible that an InGaP buffer layer in which lattice-mismatching is covered by a low-temperature growth layer or the like, is formed on an InP substrate, and an InGaAs channel layer, InGaAlP spacer layer, electron supply layer, and Schottky contact layer are grown thereon with the lattices of these layers matching with each other. Further, the InGaAlP Schottky contact layer 6 should have a thickness of no more than the critical value, beyond which conversion due to lattice-mismatching occurs.

According to each of the fifth and sixth embodiments, there is provided a HEMT having a sheet electron concentration substantially equivalent to that of the conventional InAlAs/InGaAs HEMT, and an Al ratio of each of the spacer layer and Schottky contact layer of as small as $0.3$ or even less. With such characteristics, the purity of each of the spacer layer, and Schottky contact layer can be enhanced, and the electron mobility of 2DEG can be raised. Therefore, the leak current of the Schottky contact layer can be reduced, and degradation of the exposed portion of the layer can be suppressed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A high electron mobility transistor comprising:
a main structure portion including a channel layer, a spacer layer, and n-type electron supply layer, said channel layer formed on one side of said spacer layer, and said electron supply layer formed on the other side of said spacer layer;
a semi-insulating semiconductor substrate for supporting said main structure portion;
a Schottky contact layer formed on said main structure portion;
a Schottky gate electrode formed on said Schottky contact layer;
first and second ohmic contact layers formed on said Schottky contact layer, interposing said Schottky gate electrode therebetween;
a first ohmic electrode formed on said first ohmic contact layer; and
a second ohmic electrode formed on said second ohmic contact layer;
wherein said electron supply layer has a structure represented by $In_mAl_nAs$ (where $m+n=1$, $0<m$, $0<n$), and said Schottky contact layer has a structure represented by $In_xGa_yAl_zP$ (where $x+y+z=1$, $0 \leq x \leq 0.9$, $0 \leq z \leq 0.5$).

2. A high electron mobility transistor according to claim 1, wherein each said first and second ohmic contact layers have a structure represented by $In_sGa_tAs$ (where $s+t=1$, $0 \leq s$, $0 \leq t$).

3. A high electron mobility transistor according to claim 1, wherein a buffer layer is provided between said substrate and said main structure portion.

4. A high electron mobility transistor according to claim 1, wherein said substrate is made of InP.

5. A high electron mobility transistor according to claim 4, wherein a buffer layer made of InP or InAlAs which lattice-matches with InP, is provided between said substrate and said main structure portion.

6. A high electron mobility transistor according to claim 1, wherein said substrate is made of GaAs.

7. A high electron mobility transistor according to claim 6, wherein an InGaAs graded buffer layer in which an In content is gradually increased is provided between said substrate and said main structure portion.

8. A high electron mobility transistor according to claim 1, wherein said spacer layer is made of InAlAs.

9. A high electron mobility transistor according to claim 1, wherein said channel layer is made of InGaAs.

10. A high electron mobility transistor according to claim 1, wherein said electron supply layer includes a planar doped layer.

* * * * *